United States Patent
Asano et al.

(10) Patent No.: US 6,727,559 B2
(45) Date of Patent: Apr. 27, 2004

(54) COMPOUND SEMICONDUCTOR DEVICE

(75) Inventors: Tetsuro Asano, Oizumi-machi (JP); Masahiro Uekawa, Oizumi-machi (JP); Koichi Hirata, Ashikaga (JP); Mikito Sakakibara, Menuma-machi (JP)

(73) Assignee: Sanyo Electric Co., Ltd., Osaka (JP)

( * ) Notice: Subject to any disclaimer, the term of this patent is extended or adjusted under 35 U.S.C. 154(b) by 0 days.

(21) Appl. No.: 10/177,762

(22) Filed: Jun. 24, 2002

(65) Prior Publication Data

US 2003/0013276 A1 Jan. 16, 2003

(30) Foreign Application Priority Data

Jun. 22, 2001 (JP) ........................................ 2001-188971

(51) Int. Cl.[7] .............................................. H01L 29/76
(52) U.S. Cl. ...................... 257/401; 257/240; 257/241; 257/243; 257/266; 257/280; 257/401; 257/402; 257/472; 257/631; 257/459; 436/167; 436/284; 436/286; 436/570; 436/572
(58) Field of Search .................................. 257/240, 241, 257/243, 266, 280, 281, 401, 402, 472, 631, 459; 438/167, 570, 289, 286, 572

(56) References Cited

U.S. PATENT DOCUMENTS

| | | | | | |
|---|---|---|---|---|---|
| 4,737,837 A | * | 4/1988 | Lee | ............................ | 357/46 |
| 5,148,244 A | * | 9/1992 | Iwasaki | ...................... | 357/387 |
| 5,920,083 A | * | 7/1999 | Bae | ............................ | 257/59 |
| 6,573,529 B2 | * | 6/2003 | Asano et al. | ................ | 257/20 |
| 6,597,043 B1 | * | 7/2003 | Naem | ........................ | 257/387 |
| 6,627,956 B2 | * | 9/2003 | Asano et al. | ............... | 257/358 |

* cited by examiner

*Primary Examiner*—Tom Thomas
*Assistant Examiner*—Edgardo Ortiz
(74) *Attorney, Agent, or Firm*—Morrison & Foerster LLP

(57) ABSTRACT

A local oscillation FET has a source connecting pad, a drain connecting pad and a gate connecting pad. The source connecting pad occupies one corner of a substrate, and the drain and gate connecting pads are placed at the neighboring corners so that the three connecting pads form an L shape on the substrate. As a modification to this configuration, another source connecting pad is placed at the remaining corner of the substrate so that the drain and gate connecting pads are shielded from each other by the two source connecting pads. These device configurations contribute to size reduction of the local oscillation FET.

7 Claims, 8 Drawing Sheets

PRIOR ART

PRIOR ART

[0 1̄ 1̄]

ompound SEMICONDUCTOR DEVICE

BACKGROUND OF THE INVENTION

1. Field of the Invention:

The invention relates to a compound semiconductor device employed in a device operating at high frequency, specifically to a compound semiconductor device with reduced size and improved high frequency characteristics.

2. Description of the Related Art:

The demand for high frequency devices has been rapidly increasing due to the expanding market for portable telephones and digital satellite communication equipment. Many of such devices include field effect transistors (referred to FET, hereinafter) employing a gallium arsenide (referred to GaAs, hereinafter) substrate because of its excellent high frequency characteristics. A typical device in this field is a local oscillation FET.

FIG. 1 is a cross-sectional view of a conventional GaAs FET. The GaAs substrate 151 is initially undoped, and has an n type channel region (or a channel layer) 152 formed by doping with n type dopants beneath its surface. A gate electrode 153 is placed on the surface of the channel region 152, forming a Schottky contact, and a source electrode 154 and a drain electrode 155 are placed on both sides of the gate electrode 153, forming ohmic contacts to the surface of the channel region 152. In this configuration, a voltage applied to the gate electrode 153 creates a depletion layer within the channel region 152 beneath the gate electrode 153 and, thus, controls the channel current between the source electrode 154 and the drain electrode 155.

FIG. 2 shows a conventional local oscillation FET employing a GaAs substrate. A channel region 62 is formed on a GaAs substrate and has therein a source region and a drain region. A first layer made of ohmic metal layer (AuGe/Ni/Au) 60 is formed on the source and drain regions to provide the source electrode and the drain electrode of the FET. A second layer made of a gate metal layer (Ti/Al) 70 is formed simultaneously when a gate electrode of the FET is formed. The second layer is denoted by the broken line in FIG. 2. A third layer made of a pad metal layer (Ti/Pt/Au) 80 provides connecting pads 81, 82, 83 for the drain electrode, the source electrode and the gate electrode. The source connecting pad 82 prevents signal leakage between the drain connecting pad 81 and the gate connecting pad 83, occupying a space between the two connecting pads 81, 83. Broken circles in FIG. 2 denote wire bonding positions on the connecting pads. Four bonding wires are bonded to the source connecting pad 82, and two bonding wires are bonded to each of the drain connecting pad 81 and the gate connecting pad 83. All the bonding wires are bonded to the respective connecting pads by applying pressure and heat to the contact region. The source connecting 82 is connected to a ground terminal GND via a capacitor C.

In FIG. 2, the channel region 62 is the rectangle denoted by the unevenly broken line. The two strips of the pad metal layer 80 extending from the drain connecting pad 81 are the drain electrode. The drain electrode made of the ohmic metal layer 60 is placed underneath the drain electrode made of the pad metal layer. The comb like structure with three teeth extending from the topside of the device is the source electrode made of the pad metal layer 80. The source electrode made of the ohmic metal layer 60 is placed underneath the source electrode made of the pad metal layer 80. The gate electrode is placed between the strips of the drain electrode and the teeth of the source electrode. The gate electrode is made of the gate metal layer and formed on the channel layer 62. In this configuration, the gate width Wg of the FET is defined as the summation of the lengths of the gate electrode within the channel layer 62 of the FET. Accordingly, in this FET, the total length of the four portions of the gate electrode between the strips and the teeth within the channel region 62 provides the gate width Wg. The FET of FIG. 2 has a gate width of 400 $\mu$m.

The pad metal layer 80 and the gate metal layer 70 do not intersect. In other words, this FET does not have a multi layer wiring structure. This is an important feature to avoid deterioration of high frequency characteristics of the GaAs FET due to parasitic capacitance. When the pad metal layer 80 and the gate metal layer 70 intersect each other, an insulating layer such as nitride film needs to be placed between the two layers. Such a design creates parasitic capacitance and induces leakage of the signals.

Thus, the conventional local oscillation FET is typically as large as 0.44×0.39 mm$^2$ because of the design constraint on the use of single layer wiring and the connecting pad alignment. However, size reduction of local oscillation FETs is required to reduce the cost of such devices.

SUMMARY OF THE INVENTION

The invention provides a compound semiconductor device including a compound semiconductor substrate having a substantially rectangular shape and a channel region formed on the surface of the substrate. A drain electrode, a gate electrode and a source electrode are each formed on the channel region. A drain connecting pad, a gate connecting pad and a source connecting pad are each connected to the respective electrodes. The drain connecting pad and the gate connecting pad are disposed substantially at respective corners of a first diagonal of the substrate and the source connecting pad is disposed substantially at a corner of a second diagonal of the substrate. The other corner of the second diagonal is not occupied by any other connecting pad. In this configuration, the first and second diagonals define the surface of the substrate on which the channel region is formed.

The invention also provides a compound semiconductor device including a compound semiconductor substrate having a substantially rectangular shape and a channel region formed on a surface of the substrate. A drain electrode, a gate electrode and a source electrode are each formed on the channel region. A drain connecting pad and a gate connecting pad are each connected to the respective electrodes. A first source connecting pad and a second source connecting pad are each connected to the source electrode. The drain connecting pad and the gate connecting pad are disposed substantially at respective corners of a first diagonal of the substrate and the first and second source connecting pads are disposed substantially at respective corners of a second diagonal of the substrate. In this configuration, the first and second diagonals define the surface of the substrate on which the channel region is formed. The angle made by the first and second diagonals of the substrate is between 30 and 60 degree. The gate electrode is substantially disposed in the direction of the first diagonal of the substrate.

The invention further provides a compound semiconductor device including a compound semiconductor substrate and a channel region formed on a surface of the substrate. A drain electrode, a gate electrode and a source electrode are each formed on the channel region. The drain, gate and source electrodes form a field effect transistor. A drain connecting pad and a gate connecting pad are each connected to the respective electrodes. A first source connecting pad and a second source connecting pad are each connected to the source electrode. The drain connecting pad and the gate connecting pad are disposed approximately symmetric to each other with respect to the channel region as the center of symmetry and the first and second source connecting pads are disposed approximately symmetric to each other with respect to the channel region as the center of symmetry. The gate electrode is disposed in the direction connecting the drain connecting pad and the gate connecting pad.

DETAILED DESCRIPTION OF THE INVENTION

Embodiments of this invention will be described hereinafter with reference to the FIGS. 3–8.

Figure 3A:
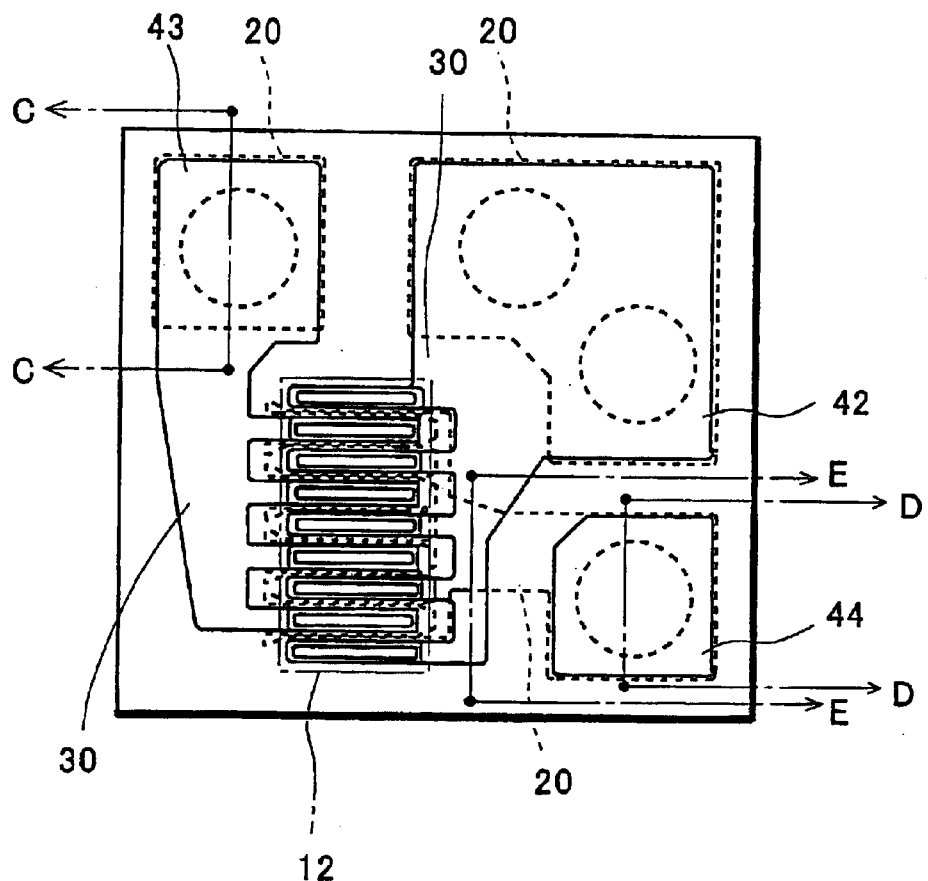
FIG. 3A is a plan view of a local oscillation FET of a first embodiment of this invention.

FIG. 3A shows a GaAs FET used for local oscillation in a first embodiment of this invention. The GaAs FET includes a channel layer 12, a source connecting pad 42, a drain connecting pad 43 and a gate connecting pad 44. An undoped epitaxial buffer layer is first formed on an undoped GaAs substrate, and an n type epitaxial layer is then formed on the undoped epitaxial buffer layer to provide a channel layer 12. A gate electrode is placed on the channel layer 12, forming a Schottky contact and source and drain electrodes are placed adjacent to the gate electrode forming ohmic contacts with the channel layer 12. In this configuration, a voltage applied to the gate electrode creates a depletion layer within the channel layer beneath the gate electrode and, thus, controls the channel current between the source electrode and the drain electrode.

In FIG. 3A, the channel region 12 is the rectangle denoted by the unevenly broken line. The comb like structure with five teeth extending from the right side of the device is a source electrode made of a pad metal layer (Ti/Pt/Au) 30, which is a third metal layer of the device. A source electrode made of an ohmic metal layer (AuGe/Ni) 10, which is a first metal layer of the device, is placed underneath the source electrode made of the pad metal layer 30. The comb like structure with four teeth extending from the left side of the device is a drain electrode made of a pad metal layer 30, which is a third metal layer of the device. A drain electrode made of the ohmic metal layer 10 is placed underneath the drain electrode made of the pad metal layer 30. Gate electrode is placed between the teeth of the source electrode and the teeth of the drain electrode, and forms a comb like structure with eight teeth. The gate electrode is made of a gate metal layer (Ti/Al) 20, which is a second metal layer of the device, and formed on the channel layer 12.

The third metal layer made of the pad metal layer is a wiring layer connecting the elements of the device and includes a source connecting pad 42, a drain connecting pad 43 and a gate connecting pad 44. The second metal layer made of the gate metal layer 20 is formed simultaneously when the gate electrode is formed. The second metal layer is also placed underneath the source connecting pad 42 and the drain connecting pad 43 to relieve stress. The gate metal layer 20 is extended to the gate connecting pad 44 and also relieves stress underneath the gate connecting pad 44. The source electrode and the drain electrode are made of the ohmic metal layer and form ohmic contacts with the substrate. The pad metal layer 30 covers the source and drain electrodes made of the ohmic metal layer 10.

In this embodiment, the gate connecting pad 44 and the drain connecting pad 43 are placed at a pair of diagonal corners of the substrate to provide a separation between the two connecting pads 43, 44 sufficient to prevent signal leakage between the two connecting pads 43, 44. Furthermore, the source connecting pad 42 is placed between the two connecting pads 43, 44 to shield one connecting pad from the other connecting pad.

Figure 3B:
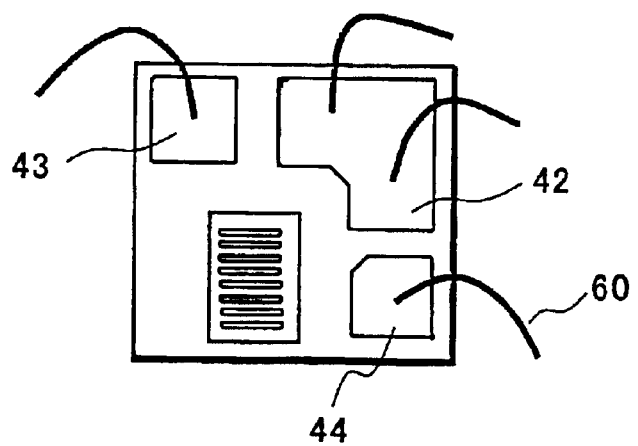
FIG. 3B is a schematic plan view of the device of FIG. 3A with bonding wires.

The four broken circles on the connecting pads of FIG. 3A denote locations for wire bonding. FIG. 3B shows a schematic view of the device after bonding wires 60 are bonded to the connecting pads. Two bonding wires 60 are bonded to the source connecting pad 42. One bonding wire 60 is bonded to each of the drain and gate connecting pads 43, 44. The source connecting pad 42 requires two bonding wires 60 to reduce electric resistance and inductance. The size of each connecting pad is large enough to provide an area for bonding a wire of about 25μ m in diameter using a ball of about 50–60 μm in diameter. Placing the connecting pads at the corners of the substrate provides enough space for bonding the wires 60.

Figure 4A:
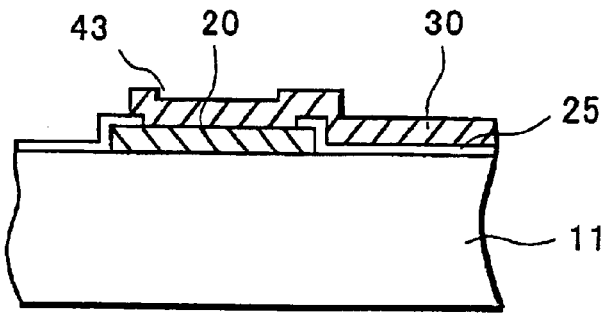
FIGS. 4A, 4B and 4C are cross-sectional views of the device of FIG. 3A cut along lines C—C, D—D and E—E, respectively, as shown in FIG. 3A.
Figure 4B:
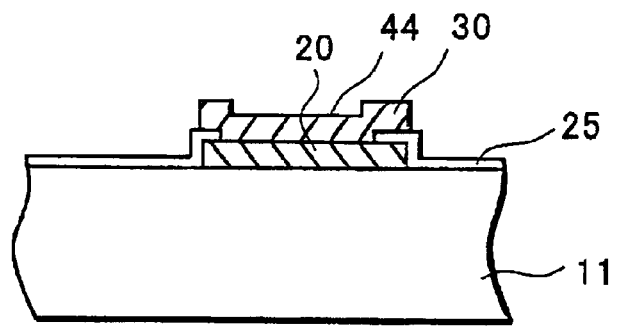
Figure 4C:
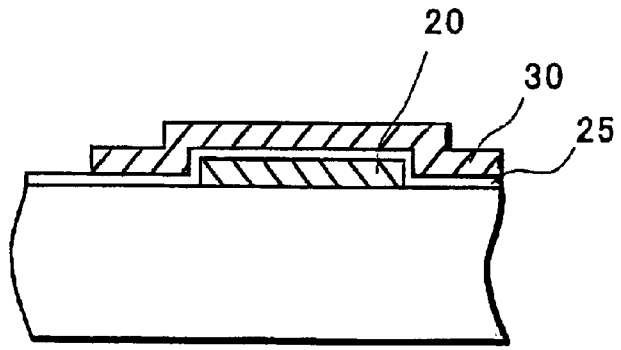

FIGS. 4A, 4B and 4C show cross-sectional views of the device cut along lines C—C, D—D and E—E in FIG. 3A, respectively.

FIG. 4A shows a cross-sectional view of the drain connecting pad 43 of the device of FIG. 3A. The gate metal layer 20 is placed on the GaAs substrate to provide the substrate, which is brittle by nature, with a stress relief mechanism. A nitride film 25 is placed on the gate metal layer 20, which has an opening. The pad metal layer 30 is placed on the nitride film 25 and connected to the gate metal layer 20 through the opening. A bonding wire is bonded to the pad metal layer 30 forming the drain connecting pad by applying high pressure under an elevated temperature. The source connecting pad 42 has substantially the same cross-sectional structure as the drain connecting pad 43.

FIG. 4B shows a cross-sectional view of the gate connecting pad 44. The gate metal layer 20 extends from the gate electrode of the FET and is connected to the pad metal layer 30, which is placed on the gate metal layer 20. A bonding wire is bonded to the pad metal layer 30 forming the gate connecting pad 44.

FIG. 4C shows a cross-sectional view of an intersection between the gate metal layer 20 and the pad metal layer 30. The nitride film 25 insulates the gate metal layer 20 from the pad metal layer 30. Such an intersectional area is located outside the channel layer 12 and has a surface area of about 400 $\mu m^2$.

In local oscillation FETs, the total surface area of the connecting pads occupies a significant portion of the device surface. By reducing the number of the connecting pads, the device of this embodiment has an overall device size much smaller than the conventional device shown in FIG. 2. For example, based on the following design rules, the device size of this embodiment is about 0.27×0.27 $mm^2$, which is a 57% reduction from the size of the device of FIG. 2. The rules are, 1) the pad center to pad center distance is 80 $\mu m$, 2) the pad needs an area of about 60×60 $\mu m^2$ for each bonding wire, 3) the separation between the edges of the pad and the dicing region is 10 $\mu m$, and 4) the width of the dicing region is 50 $\mu m$.

In this embodiment, the device has a double layer wiring structure as shown in FIG. 4C, which leads to a small amount of signal loss. However, experiments have shown that the signal loss is negligible when the intersection between the gate metal layer 20 and the pad metal layer 30 is placed outside the channel region 12 and the size of the intersection is equal to about 400 $\mu m^2$ or smaller. It should be noted that this condition applies to an intersection between wiring lines connected to the gate electrode and the source electrode. An intersection between the wiring lines connected to the gate electrode and the drain electrode may cause more signal loss.

Figure 5A:
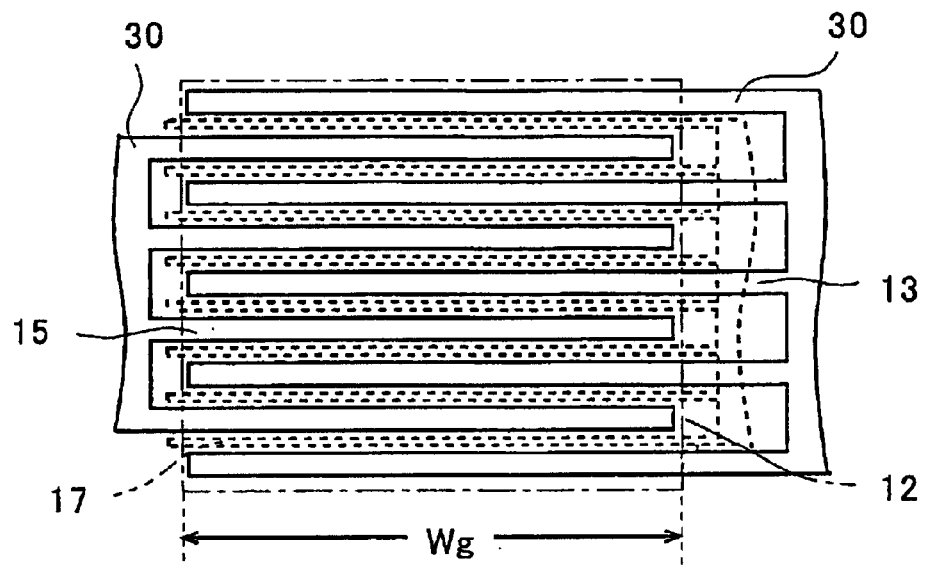
FIG. 5A is an expanded plan view of the FET portion of the device of FIG. 3A.

FIG. 5A shows an expanded plan view of the FET portion of FIG. 3A. In FIG. 5A, the channel region 12 formed on the substrate 11 is the rectangle denoted by the unevenly broken line. The comb like structure with five teeth extending from the right side of the device is the source electrode made of the pad metal layer (Ti/Pt/Au) 30, which is the third metal layer of the device. The source electrode made of the ohmic metal layer (AuGe/Ni) 10, which is the first metal layer of the device, is placed underneath the source electrode made of the pad metal layer 30. The comb like structure with four teeth extending from the left side of the device is the drain electrode made of the pad metal layer 30, which is the third metal layer of the device. The drain electrode made of the ohmic metal layer 10 is placed underneath the drain electrode made of the pad metal layer 30. The gate electrode is placed between the teeth of the source electrode and the teeth of the drain electrode, and forms a comb like structure with eight teeth. The gate electrode is made of the gate metal layer (Ti/Al) 20, which is a second metal layer of the device, and formed on the channel layer 12. The gate width Wg of this FET is a summation of the lengths of the eight teeth of the gate comb structure located inside the channel layer 12. In this embodiment, the gate width Wg is about 400 $\mu m$.

Figure 5B:
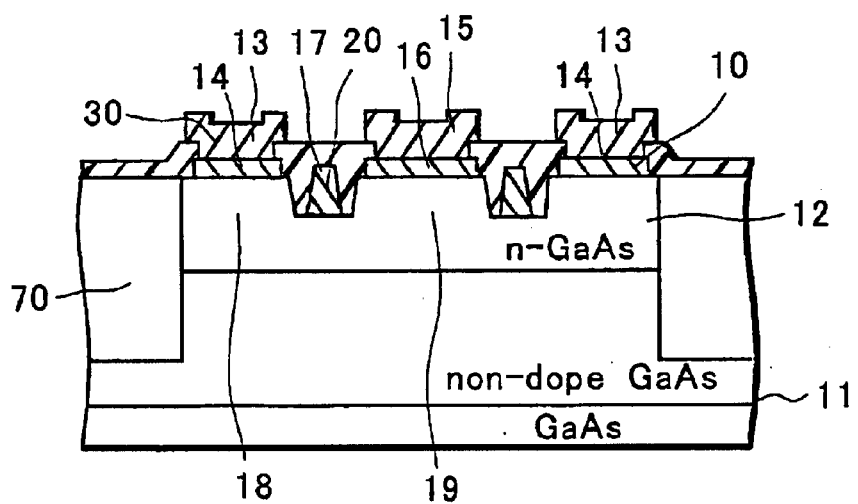
FIG. 5B is a cross-sectional view of the FET portion of FIG. 5A cut perpendicular to the direction of the gate electrode.

FIG. 5B shows a cross-sectional view of the FET portion of FIG. 5A. The substrate 11 has the channel layer 12 made of an n type epitaxial layer. An insulating portion 70 is formed adjacent to the channel layer 12 by injecting boron ions and the like. The insulating portion 70 insulates the channel layer 12 from other portions of the substrate 11. The gate electrode 17 made of the gate metal layer 20 is placed on the channel layer 12. The operational area of the FET is the area of the channel layer 12 underneath the gate electrode 17. The drain electrode 16 and the source electrode 14 made of the ohmic metal layer 10 are placed on the area of the channel layer 12 adjacent to the area for the gate electrode 17. The pad metal layer 30 is placed on the ohmic metal layer 10 and provides connections to other elements of the device.

Figure 6A:
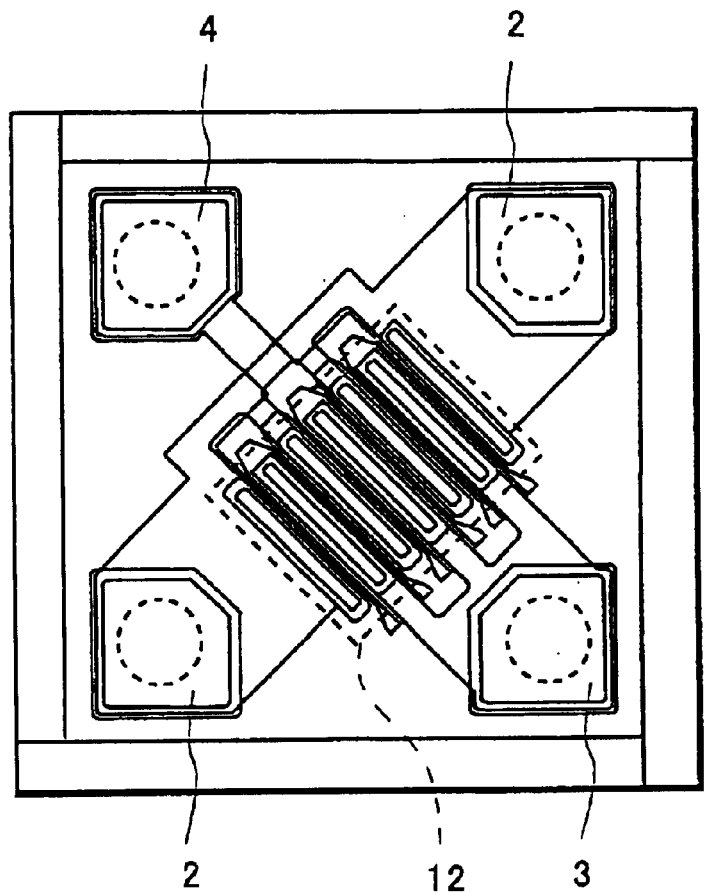
FIG. 6A is a plan view of a local oscillation FET of a second embodiment of this invention.
Figure 6B:
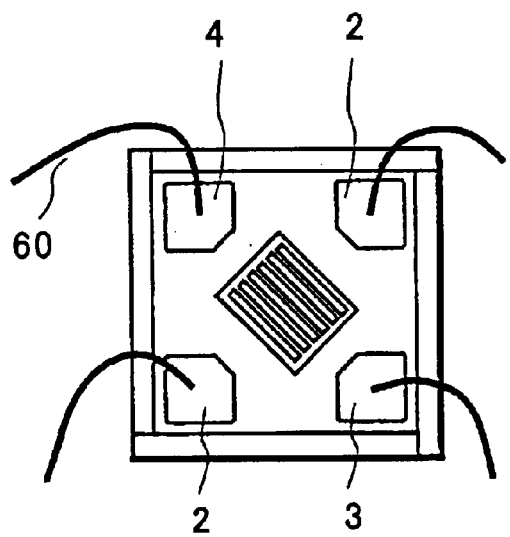
FIG. 6B is a schematic plan view of the device of FIG. 6A with bonding wires.

FIGS. 6A and 6B show another local oscillation FET as a second embodiment of this invention. FIG. 6A is a plan view of a GaAs FET of the second embodiment. The device includes a channel layer 12, a source connecting pad 2, a drain connecting pad 3 and a gate connecting pad 4. An undoped epitaxial buffer layer is first formed on an undoped GaAs substrate, and an n type epitaxial layer is then formed on the undoped epitaxial buffer layer to provide a channel layer 12. A gate electrode is placed on the channel layer 12 forming a Schottky contact and a source and drain electrode are placed adjacent to the gate electrode forming ohmic contacts with the channel layer 12. In this configuration, a voltage applied to the gate electrode creates a depletion layer within the channel layer beneath the gate electrode and, thus, controls the channel current between the source electrode and the drain electrode.

In FIG. 6A, the channel region 12 is the rectangle denoted by the unevenly broken line. The comb like structure with four teeth extending from the upper left corner of the device is a source electrode made of a pad metal layer (Ti/Pt/Au) 30, which is a third metal layer of the device. A source electrode made of an ohmic metal layer (AuGe/Ni) 10, which is a first metal layer of the device, is placed underneath the source electrode made of the pad metal layer 30. The comb like structure with three teeth extending from the lower right corner of the device is a drain electrode made of a pad metal layer 30, which is a third metal layer of the device. A drain electrode made of the ohmic metal layer 10 is placed underneath the drain electrode made of the pad metal layer 30. The gate electrode is placed between the teeth of the source electrodes and the teeth of the drain electrode, and forms a comb like structure with six teeth. The gate electrode is made of a gate metal layer (Ti/Al) 20, which is a second metal layer of the device, and formed on the channel layer 12.

The third metal layer made of the pad metal layer is a wiring layer connecting the elements of the device and includes a source connecting pad 2, a drain connecting pad 3 and a gate connecting pad 4. The second metal layer made of the gate metal layer 20 is formed simultaneously when the gate electrode is formed. As is the case with the first embodiment, the second metal layer of the second embodiment is also placed underneath the source connecting pad 2 and the drain connecting pad 3 to relieve stress relaxation. Similarly, the gate metal layer 20 is extended to the gate connecting pad 4 and also provides stress relief underneath the gate connecting pad 4. The source electrode and the drain electrode are made of the ohmic metal layer and form ohmic contacts with the substrate. The pad metal layer 30 covers the source and drain electrodes made of the ohmic metal layer 10.

In this embodiment, the gate connecting pad 4 and the drain connecting pad 3 are placed at a pair of diagonal corners of the substrate 11. The two source connecting pads are placed at another pair of diagonal corners of the substrate 11. Placing one source connecting pad 2 on each of the two possible paths of signal leakage further prevents signal leakage between the gate connecting pad 4 and the drain connecting pad 3.

The broken circle on each of the connecting pads of FIG. 6A denotes the locations for wire bonding. The size of each connecting pad is large enough to provide an area for bonding a wire of about 25$\mu$ m in diameter using a ball of about 50–60$\mu$ m in diameter. FIG. 6B shows a schematic view of the device after bonding wires 60 are bonded to the connecting pads. One bonding wire 60 is bonded to each connecting pad. Two bonding wires bonded to the source connecting pads 2, which are connected to a ground voltage, further shield the drain connecting pad 3 from the gate connecting pad 4. This, therefore, reduces signal leakage between the gate connecting pad 4, which is connected to an input terminal via the bonding wire 60, and the drain connecting pad 3, which is connected to an output terminal via the bonding wire 60. Accordingly, a scattering parameter of high frequency characteristics (S12) is reduced and the high frequency gain of the FET improves.

Furthermore, the distance between the two neighboring bonding wires 60 coming out of the device is larger than that of the first embodiment because the bonding wires are extended in the radial direction from the four corners of the substrate 11. This configuration significantly reduces leakage between the neighboring bonding wires 60 and, thus, further improves the high frequency gain of the FET.

The cross-sectional structures of the gate connecting pad 4, the drain connecting pad 3, the source connecting pad and the intersection between the pad metal layer 30 and the gate metal layer 20 are substantially the same as the structures of the first embodiment described with reference to FIGS. 4A, 4B and 4C. The planar configuration and the cross-sectional structure of the FET portion of this embodiment is substantially the same as those of the FET of the first embodiment described with reference to FIGS. 5A and 5B. Accordingly, redundant descriptions are avoided.

The device of the second embodiment has several features to further reduce the overall chip size. First, the inside corners of the four connecting pads are truncated to provide extra space for the FET portion. Second, the gate electrode, the source electrode and the drain electrode are aligned in the direction of one of the diagonals of the substrate 11, i.e. the direction connecting the gate connecting pad 4 and the drain connecting pad 3. In this embodiment, the angle between the edge of the substrate 11 and the direction of the diagonal is about 45 degrees. This configuration creates more space available for FET formation in the center of the substrate 11, and thus eliminates dead space from the surface of the substrate 11. The overall chip size of the second embodiment is about 0.26×0.26 mm$^2$ in comparison to 0.27×0.27 mm$^2$ of the first embodiment.

Furthermore, this configuration further reduces signal loss due to the parasitic capacitance formed at the intersection between the pad metal layer 30 and the gate metal layer 20, which are insulated from each other by the nitride film 25 formed therebetween. Because of the space available in the center of the substrate 11, the length of each tooth of the gate comb is longer than the length of the first embodiment. This allows for a smaller number of the teeth of the gate comb while keeping the same gate width, and thus reduces the area of the intersection. For example, while keeping the same gate width, 400 $\mu$m, as the first embodiment, the number of the teeth of the gate electrode of the second embodiment reduces to six from the number of the teeth of the gate electrode of the first embodiment, eight. Accordingly, the area of the intersection reduces to 285 $\mu$m from 400 $\mu$m in the first embodiment. This reduction further improves the high frequency characteristics of the device of the second embodiment.

When the above configuration with six gate electrode teeth is modified to have eight electrode teeth, as in the case of the first embodiment, the chip size was further reduce to 0.25×0.25 mm$^2$. However, because of the increased parasitic capacitance associated with the increased intersection area, the high frequency characteristics of such a device is somewhat degraded.

The separation between the two neighboring bonding wires are 110 $\mu$m when the chip size is 0.25×0.25 mm$^2$. This separation can be increased to 120 $\mu$m by increasing the chip size to 0.26×0.26 mm$^2$ for meeting other requirements including easier assembly and less leakage between the bonding wires 60.

Figure 7A:
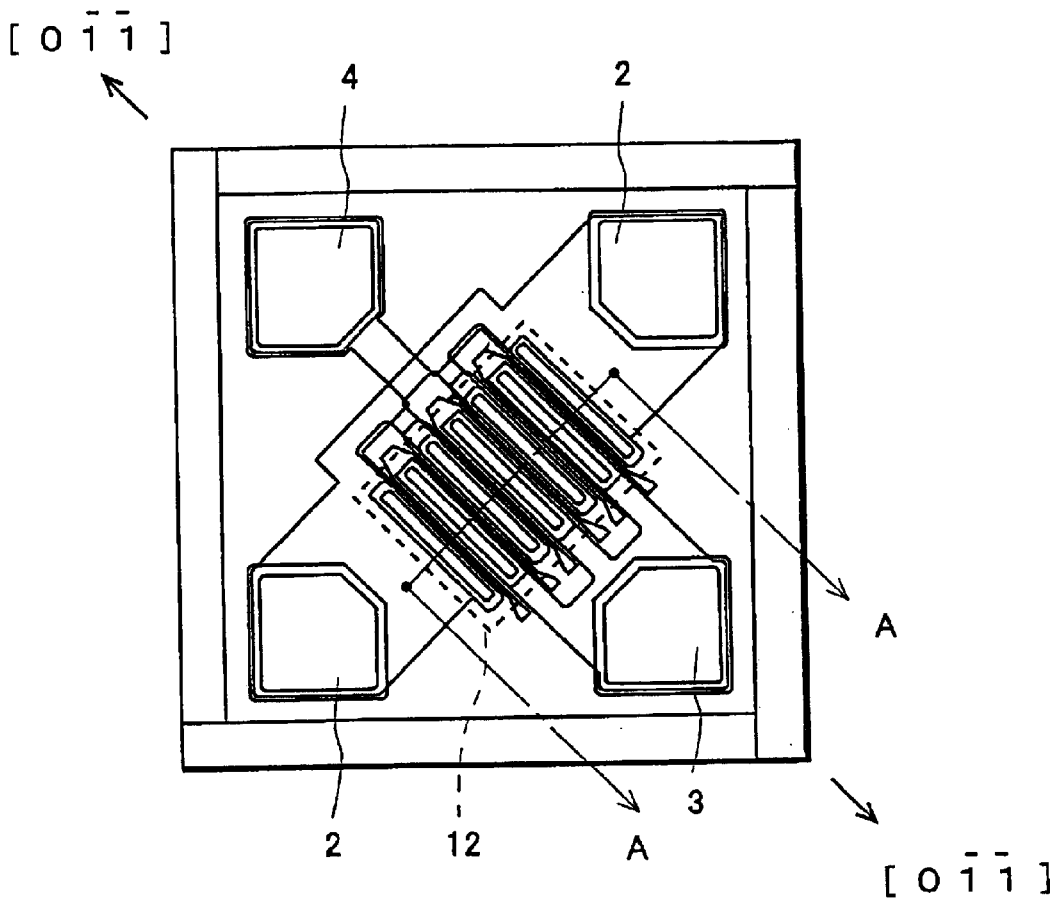
FIG. 7A is a plan view of a modified local oscillation FET of the second embodiment.
Figure 7B:
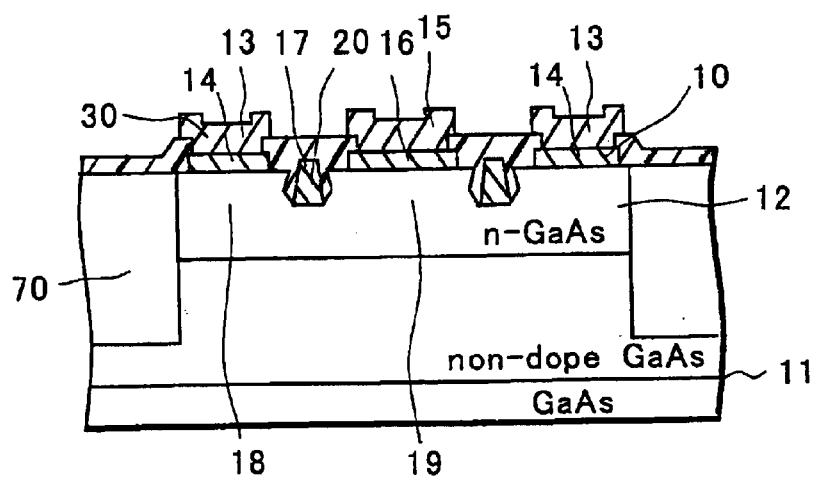
FIG. 7B is cross-sectional view of the FET portion of the device of FIG. 7A cut along line A—A in FIG. 7A.

FIGS. 7A and 7B show a modification of the second embodiment of this invention. The planar device configuration of FIG. 7A is the same as the planar configuration of FIG. 6A except that crystallographic orientation of the substrate 11, which is made of GaAs having a zincblende lattice structure, is defined in this modification. On the other hand, the substrate 11 of FIG. 6A can be cut from any direction of the GaAs. The substrate of the device of FIG. 7A is cut to expose a (1 0 0) plane of the zincblende structure and the gate electrodes are substantially aligned in the direction of [0 1 1], as shown in FIG. 7A. In this description, Miller indices are used to denote planes and directions of crystallographic lattice.

FIG. 7B shows a cross-sectional view of the FET portion of the device of FIG. 7A. Because of the crystallographic orientation of the substrate 11, the recess for the gate electrode 17 formed by etching the (1 0 0) surface has a cross-section shown in FIG. 7B. In this configuration, most of the channel layer surface at the bottom of the recess is covered by the gate electrode. Because uncovered channel layer surface gives rise to deteriorated phase noise characteristics, the device of FIG. 7B has superior phase noise characteristics compared to the device of FIG. 6A, which has a significant portion of the channel layer surface uncovered by the gate electrode at the bottom of the recess, as shown in FIG. 5B. Good phase noise characteristics are especially important for a local oscillation FET.

Figure 8:
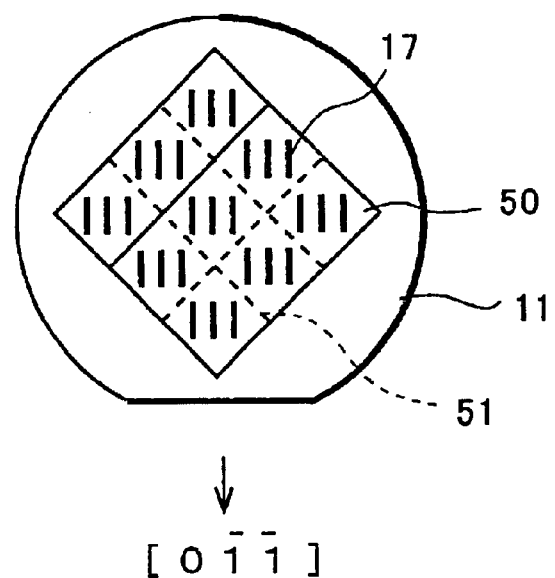
FIG. 8 is a schematic plan view of a wafer having the local oscillation FETs formed thereon with a specific crystallographic orientation.

FIG. 8 shows an alignment of multiple chips 50 on a substrate 11. One of the diagonals of each chip is aligned perpendicular to the orientational flat of the substrate 11. In other words, the gate electrode of the chips 50 is aligned parallel to the [0 1 1] direction. In such a configuration, the dicing regions 51 between the chips 50 are aligned in the [0 0 1] or [0 1 0] directions, which produce less chipping of chip edges during dicing. This allows the width of the dicing region 51 to be reduced from 50 $\mu$m to 40 $\mu$m, thus, resulting in overall size reduction of the device. For example, the size of the device shown in FIG. 7A is reduced from 0.26×0.26 mm$^2$ to 0.25×0.25 mm$^2$ with the reduction of the width of the dicing region 51. When the device of FIG. 7A is modified to have eight gate electrode teeth, as in the case of the first embodiment, the reduction of the width of the dicing region 51 reduces the device size from 0.25×0.25 mm$^2$ to 0.24×0.24 mm$^2$. All the surface and direction indices described above include their crystallographic equivalents.

Figure 1:
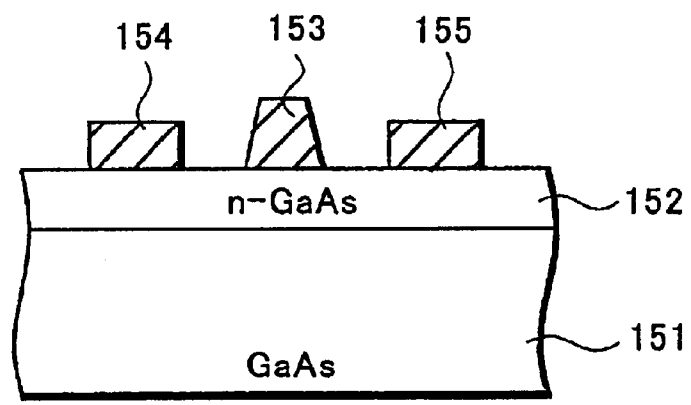
FIG. 1 is a cross-sectional view of a conventional local oscillation FET.
Figure 2:
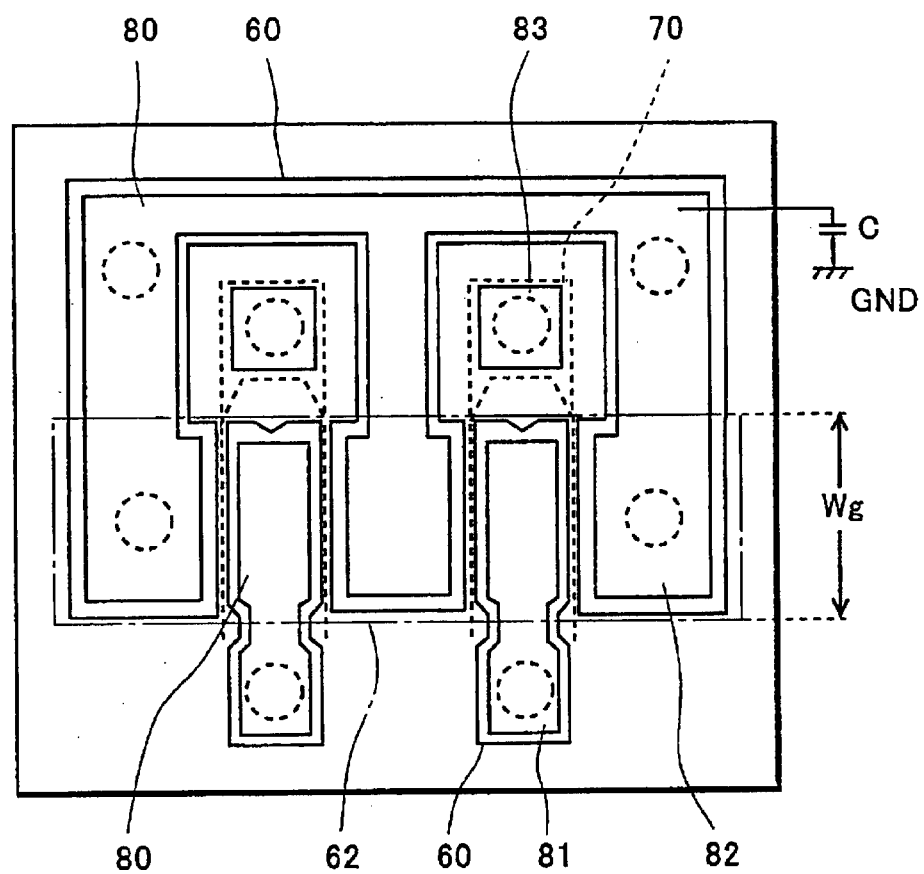
FIG. 2 is a plan view of a conventional local oscillation FET.

The size reduction of the local oscillation FET chip provided by these embodiments significantly reduces the cost of the device. For example, approximately 15 thousand chips are manufactured from a single GaAs wafer when the device has a conventional size of 0.44×0.39 mm$^2$, as shown in FIG. 2. Approximately fifty two thousand chips are manufactured from the same GaAs wafer when the device has a size of 0.27×0.27 mm$^2$. The number is fifty six thousand when the device size is 0.26×0.26 mm$^2$. The number is sixty thousand when the device size is 0.25×0.25 mm$^2$. The number further increases to sixty five thousand when the device size is 0.24×0.24 mm$^2$. Since the most expensive component of the device is the GaAs substrate itself, the size reduction above significantly contributes to the cost reduction of the device.

The above is a detailed description of particular embodiments of the invention which is not intended to limit the invention to the embodiments described. It is recognized that modifications within the scope of the invention will occur to a person skilled in the art. Such modifications and equivalents of the invention are intended for inclusion within the scope of this invention.

What is claimed is:

1. A compound semiconductor device comprising:

a compound semiconductor substrate having a substantially rectangular shape;

a channel region formed on a surface of the substrate;

a drain electrode, a gate electrode and a source electrode each formed on the channel region;

a drain connecting pad and a gate connecting pad each connected to the respective electrodes; and a first source connecting pad and a second source connecting pad each connected to the source electrode, wherein the drain connecting pad and the gate connecting pad are disposed substantially at respective corners of a first diagonal of the substrate and the first and second source connecting pads are disposed substantially at respective corners of a second diagonal of the substrate, the first and second diagonals defining the surface of the substrate on which the channel region is formed, an angle made by the first diagonal of the substrate and an edge of the substrate is between 30 and 60 degrees, an angle made by the second diagonal of the substrate and an edge of the substrate is between 30 and 60 degrees, and the gate electrode is substantially disposed in a same direction as the first diagonal of the substrate.

2. The compound semiconductor device of claim 1, wherein the substrate comprises a zincblende lattice, the surface of the substrate comprises a (1 0 0) surface of the zincblende lattice or an equivalent surface thereof, and the gate electrode is disposed in the direction of [0 1 1] of the zincblende lattice or an equivalent direction thereof.

3. The compound semiconductor device of claims 1, further comprising an insulating film disposed between the gate electrode and the source electrode so that the gate and source electrodes partially overlap each other outside the channel region.

4. The compound semiconductor device of claim 4, wherein each of the drain connecting pad, the gate connecting pad and the first and second source connecting pads is bonded to a corresponding bonding wire.

5. The compound semiconductor device of claims 1, wherein the substrate comprises a GaAs substrate.

6. The compound semiconductor device of claims 1, wherein the gate electrode forms Schottky contact to the channel region and the drain and source electrodes form ohmic contact to the channel region.

7. A compound semiconductor device comprising:

a compound semiconductor substrate;

a channel region formed on a surface of the substrate;

a drain electrode, a gate electrode and a source electrode each formed on the channel region, the drain, gate and source electrodes forming a field effect transistor;

a drain connecting pad and a gate connecting pad each connected to the respective electrodes; and a first source connecting pad and a second source connecting pad each connected to the source electrode, wherein the drain connecting pad and the gate connecting pad are disposed approximately symmetric to each other with respect to the channel region as center of symmetry and the first and second source connecting pads are disposed approximately symmetric to each other with respect to the channel region as center of symmetry, and the gate electrode is disposed in a direction connecting the drain connecting pad and the gate connecting pad.

* * * * *